United States Patent
Kikuchi et al.

(10) Patent No.: US 9,925,673 B2
(45) Date of Patent: Mar. 27, 2018

(54) POWER SUPPLYING MODULE

(71) Applicant: NITTA CORPORATION, Osaka-shi, Osaka (JP)

(72) Inventors: Hiroki Kikuchi, Yamatokoriyama (JP); Nobuhiro Omote, Yamatokoriyama (JP)

(73) Assignee: NITTA CORPORATION, Osaka (JP)

(*) Notice: Subject to any disclaimer, the term of this patent is extended or adjusted under 35 U.S.C. 154(b) by 0 days.

(21) Appl. No.: 15/535,866

(22) PCT Filed: Dec. 9, 2015

(86) PCT No.: PCT/JP2015/084531
§ 371 (c)(1),
(2) Date: Jun. 14, 2017

(87) PCT Pub. No.: WO2016/104150
PCT Pub. Date: Jun. 30, 2016

(65) Prior Publication Data
US 2017/0348861 A1    Dec. 7, 2017

(30) Foreign Application Priority Data
Dec. 26, 2014 (JP) ................... 2014-264305

(51) Int. Cl.
*H01R 13/58* (2006.01)
*B25J 19/00* (2006.01)
(Continued)

(52) U.S. Cl.
CPC ....... *B25J 19/0025* (2013.01); *B25J 15/0408* (2013.01); *H01R 13/42* (2013.01);
(Continued)

(58) Field of Classification Search
None
See application file for complete search history.

(56) References Cited

U.S. PATENT DOCUMENTS

| 4,763,401 A | 8/1988 | Marinoni et al. |
| 6,979,779 B2 * | 12/2005 | Grady .................... H02G 3/126 174/50 |

(Continued)

FOREIGN PATENT DOCUMENTS

| JP | S63-30183 | 2/1988 |
| JP | H06-190760 | 7/1994 |

(Continued)

OTHER PUBLICATIONS

International Search Report dated Feb. 9, 2016 in International Application No. PCT/JP2015/084531.

*Primary Examiner* — Tho D Ta
(74) *Attorney, Agent, or Firm* — Wentsler LLC

(57) ABSTRACT

A power supplying module that can be reduced in size is provided. The power supplying module includes a module body, and a lead-in unit provided on one surface of the module body. The lead-in unit includes a plate unit that fixes at least one sealing tube to the one surface of the module body, and at least one circumference holding unit that holds a circumference of the corresponding sealing tube. The plate unit is provided with, in a longitudinal direction of the one surface of the module body, a plurality of cable insertion holes, and a plurality of positioning portions that position the plurality of circumference holding units to the corresponding cable insertion holes.

4 Claims, 6 Drawing Sheets

(51) Int. Cl.
*B25J 15/04* (2006.01)
*H01R 13/64* (2006.01)
*H01R 13/42* (2006.01)
H05K 5/06 (2006.01)
H01R 25/00 (2006.01)

(52) U.S. Cl.
CPC .......... *H01R 13/64* (2013.01); *H01R 25/006* (2013.01); *H05K 5/069* (2013.01)

(56) References Cited

U.S. PATENT DOCUMENTS

| | | | | |
|---|---|---|---|---|
| 8,035,029 | B2* | 10/2011 | Mullen | H02G 3/088 |
| | | | | 174/50 |
| 8,604,362 | B2* | 12/2013 | Hsu | H02G 3/083 |
| | | | | 16/2.1 |
| 8,819,893 | B2* | 9/2014 | Shishido | F16L 5/02 |
| | | | | 16/2.2 |
| 9,415,695 | B2* | 8/2016 | Moon | H05K 5/069 |

FOREIGN PATENT DOCUMENTS

| | | |
|---|---|---|
| JP | 2001-35567 | 2/2001 |
| JP | 2001-332320 | 11/2001 |
| JP | 2012-250327 | 12/2012 |

\* cited by examiner

POWER SUPPLYING MODULE

TECHNICAL FIELD

The present invention relates to a power supplying module, and particularly relates to a power supplying module applied to a tool changer.

BACKGROUND ART

A disclosed tool changer (for example, Patent Literature 1) that is applied to an industrial robot as one of various instruments includes a male member attached to the robot and a female member attached to a tool. The tool changer is provided with, depending on its usage, power supplying modules for transmitting electrical power or an electric signal from the robot to the tool through a cable. The power supplying modules are attached to the male member and the female member, respectively, and include contact portions that are electrically connected to each other when the male member and the female member are coupled to each other, and connector units to which external cables are connected.

CITATION LIST

Patent Literature

Patent Literature 1: Japanese Patent Laid-open No. 2012-250327

SUMMARY OF INVENTION

Technical Problem

However, in such a conventional power supplying module, typically, each connector unit includes a triplex-cable connector to transfer, for example, electrical power, and this results in increase in its size. In particular, the thickness of the power supplying module is restricted by the size of the connector unit and cannot be reduced.

It is thus an object of the present invention to provide a power supplying module that can be reduced in size.

Solution to Problem

A power supplying module according to the present invention detachably attached to one of a first coupling member and a second coupling member that are included in an automatic tool changer, the first coupling member being detachably attached to a body of an instrument, the second coupling member being detachably attached to a tool of the instrument, includes a module body and a lead-in unit provided on one surface of the module body. The lead-in unit includes a plate unit that fixes at least one sealing tube to the one surface of the module body, and at least one circumference holding unit that holds a circumference of the corresponding sealing tube. The plate unit is provided with, in a longitudinal direction of the one surface of the module body, a plurality of cable insertion holes, and a plurality of positioning portions that position the plurality of circumference holding units to the corresponding cable insertion holes.

Advantageous Effects of Invention

According to the present invention, in the lead-in unit, cables are disposed in the longitudinal direction of the one surface of the module body. Thereby the thickness of the module body is reduced. Accordingly, the power supplying module is reduced in size.

DESCRIPTION OF EMBODIMENT

An embodiment of the present invention will be described in detail below with reference to the accompanying drawings.

(1) Entire Configuration

Figure 1:
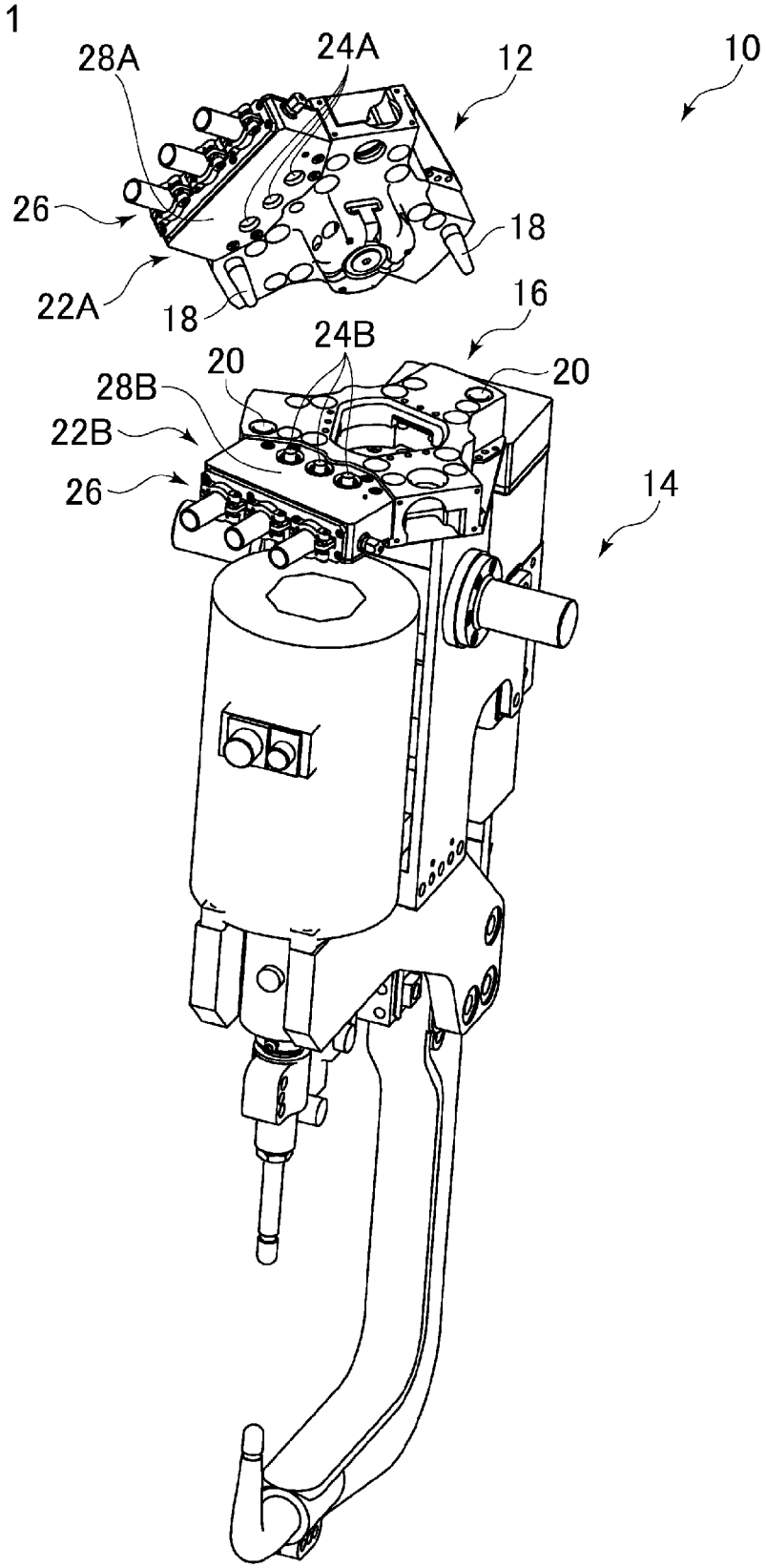
FIG. 1 is a perspective view illustrating a use-state of a power supplying module according to the present embodiment.

A tool changer 10 illustrated in FIG. 1 includes a male member 12 as a first coupling member to be fixed to a leading end (not illustrated) of an arm as a body of an industrial robot, and a female member 16 as a second coupling member to be fixed to a tool 14. The male member 12 is accurately positioned with respect to the female member 16 when a positioning pin 18 provided to a male body 17 is inserted into a positioning hole 20 formed in a female body 19 of the female member 16. Although FIG. 1 illustrates a spot welding gun, the tool 14 is not particularly limited. The male member 12 and the body are detachably fastened to the female member 16 and the tool 14 by a fastening member such as a bolt (not illustrated). The body and the tool 14 are coupled to each other in the tool changer 10, and are separable from each other.

Power supplying modules 22A and 22B are attached to the male member 12 and the female member 16, respectively. The power supplying modules 22A and 22B are provided with module bodies 28A and 28B, contact portions 24A and 24B, and lead-in units 26, respectively. Power supply lines (not illustrated) are led into the module bodies 28A and 28B through the lead-in units 26. In the tool changer 10, when the male member 12 and the female member 16 are coupled to each other, the contact portions 24A and 24B are electrically connected to each other so that electrical power is supplied from the body to the tool 14. In the following, the thickness refers to the length of the module body 28A or 28B in a direction in which the male member 12 and the female member 16 are coupled to each other. A longitudinal direction refers to a direction orthogonal to the direction of the thickness of the module body 28A or 28B and parallel to a surface of the module body 28A or 28B.

Figure 2:
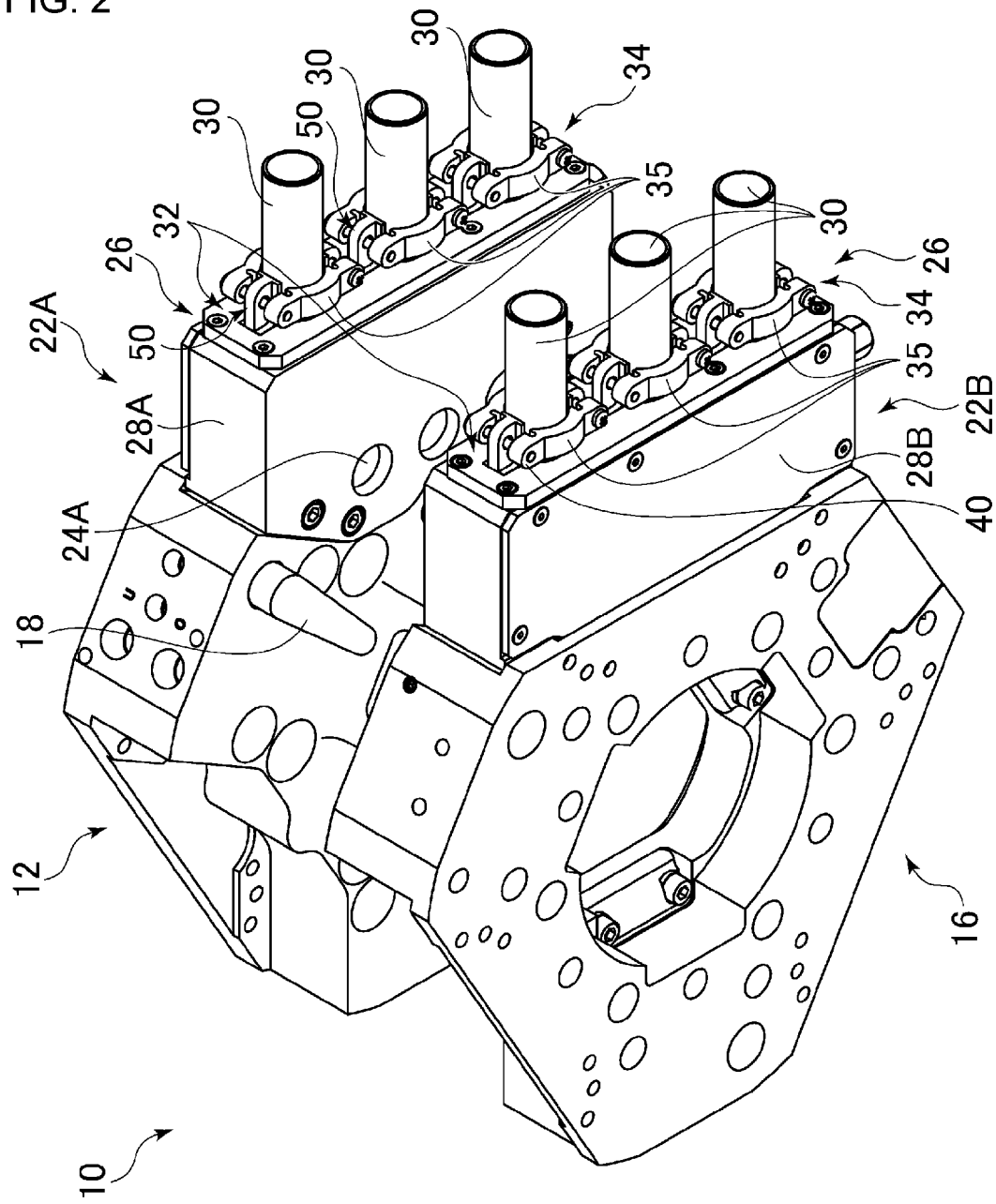
FIG. 2 is a perspective view illustrating a configuration of the power supplying module according to the present embodiment.

As illustrated in FIG. 2, the lead-in unit 26 is provided on one surface of the module body 28A, and the lead-in unit 26 is provided on one surface of the module body 28B. Each lead-in unit 26 includes a plate unit 32 and circumference holding units 34. In each lead-in unit 26, a plurality of sealing tubes 30 are fixed to the one surface of the module body 28A or 28B and the circumference holding units 34 hold circumferences of the sealing tubes 30. In the present embodiment, the lead-in unit 26 is formed such that three sealing tubes 30 are fixed in a row in the longitudinal direction of the one surface of the module body 28A or 28B. Although not illustrated in FIG. 2, each power supply line is a triplex cable and separated into three single-core cables. The single-core cables are inserted into the respective sealing tubes 30. Thus, the power supply lines are led into the module bodies 28A and 28B through the lead-in units 26.

The circumference holding unit 34 includes an arc-shaped portion 35 having an arc shape and fastening portions 40 provided at both ends of the arc-shaped portion 35. The circumference holding units 34 are used in pairs. The arc-shaped portions 35 are in contact with the circumference of the sealing tube 30 such that the arc-shaped portions 35 are disposed around the circumference of the corresponding sealing tube 30 and the fastening portions 40 are disposed to face each other, and the fastening portions 40 facing each other are fastened by a fastening member such as a bolt to hold the circumference of the sealing tube 30.

Figure 3A:
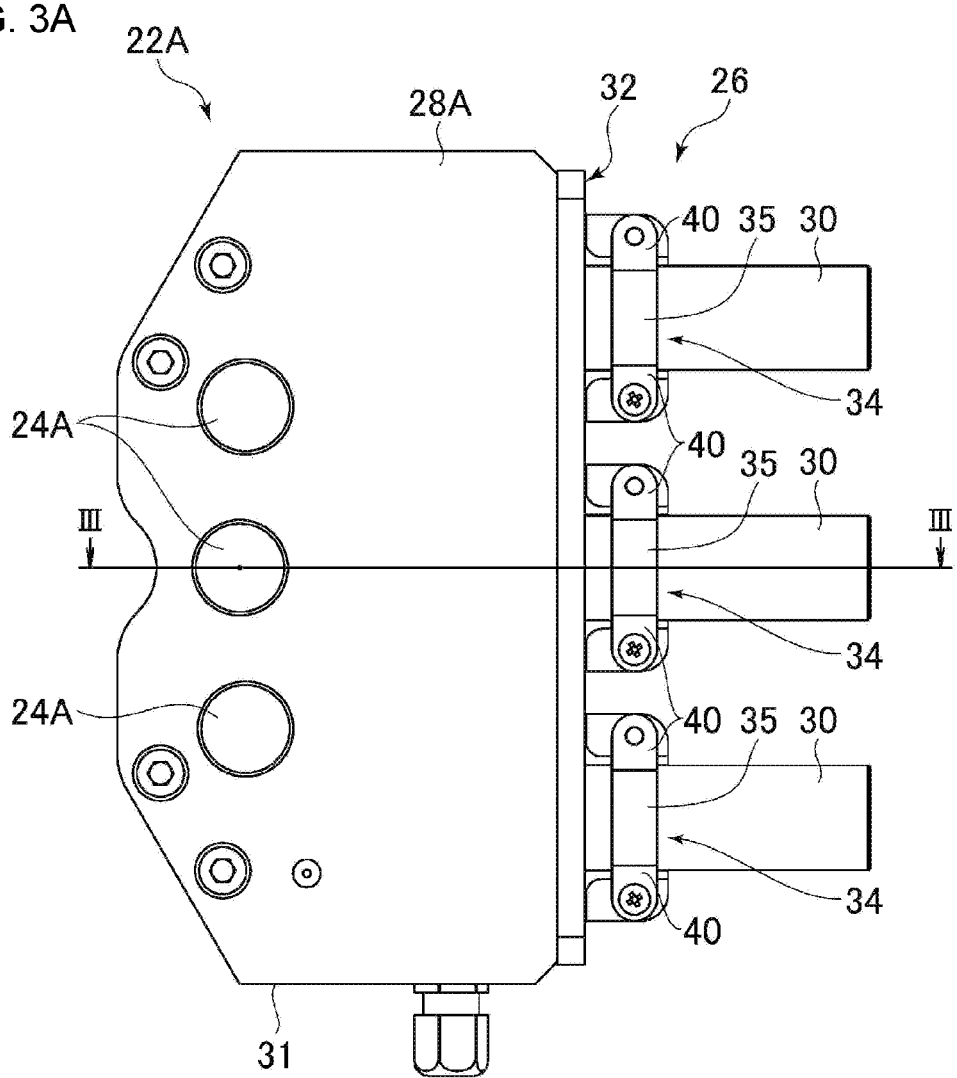
FIG. 3A is a plan view illustrating the configuration of the power supplying module according to the present embodiment and FIG. 3B is a cross-sectional view taken along line III-III in FIG. 3A.
Figure 3B:
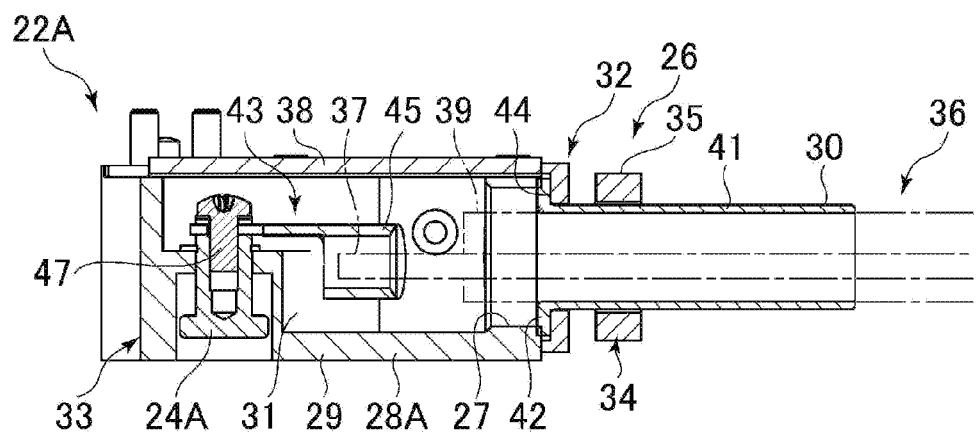

The configurations of the module bodies 28A and 28B will be described in detail with reference to FIGS. 3A and 3B. The module bodies 28A and 28B include the same or similar main-part configuration when used with the male member 12 or the female member 16, and therefore the following description will be made only on the module body 28A, which is used with the male member 12. The module body 28A includes a container unit 33 including a bottom portion 29 and a side portion 31, which are integrally formed. The container unit 33 has an opening formed in a ceiling portion opposite to the bottom portion 29, and the opening is closed by a flange 38. A lead-in opening 27 is formed on one surface of the container unit 33, and the lead-in unit 26 is fixed to the lead-in opening 27.

An electric connection unit 43 is provided in the container unit 33. The electric connection unit 43 is configured to electrically connect the contact portion 24A to a single-core cable 36 led into the module body 28A through the lead-in unit 26. The electric connection unit 43 includes a receiving unit 45, and a coupling unit 47. The coupling unit 47 electrically connects the receiving unit 45 and the contact portion 24A. The contact portion 24A has one end exposed from the bottom portion 29 of the container unit 33, and the other end connected to the electric connection unit 43.

In the single-core cable 36, a conductive wire 37 is covered by a covering member 39. Each sealing tube 30 includes a cylindrical portion 41 and a flange portion 42, which is integrally formed with a leading end of the cylindrical portion 41. The single-core cable 36 is inserted from a base end of the sealing tube 30 and led into the container unit 33. A circumference of the cylindrical portion 41 of the sealing tube 30 is held by the circumference holding unit 34, thereby a sealing property between the covering member 39 of the single-core cable 36 and the inner circumferential surface of the sealing tube 30 is maintained. A leading end of the conductive wire 37 is inserted into the receiving unit 45 and connected to the electric connection unit 43 by swaging the receiving unit 45. The flange portion 42 is sandwiched between the plate unit 32 and the one surface of the module body 28A, thereby the sealing tube 30 is fixed in a state that the sealing property between the lead-in unit 26 and the module body 28A is maintained.

Figure 4A:
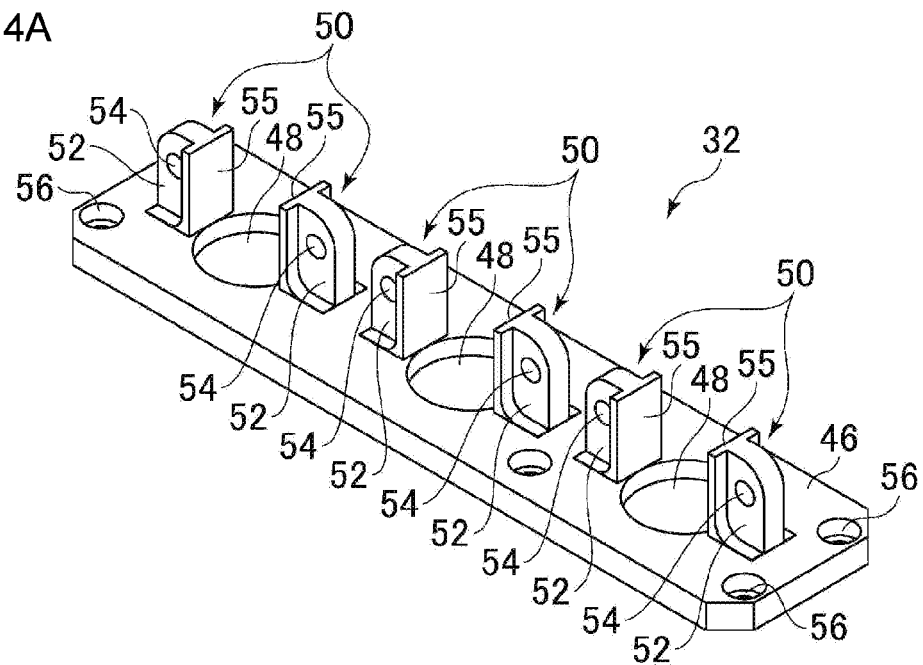
FIG. 4A is a perspective view illustrating the configuration of a plate unit according to the present embodiment and FIG. 4B is a front view illustrating the configuration of a plate unit according to the present embodiment.
Figure 4B:
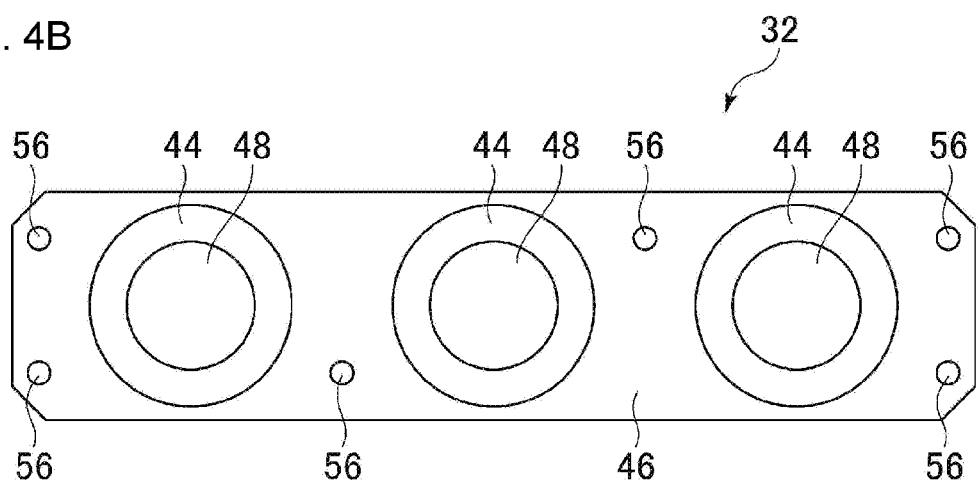

As illustrated in FIGS. 4A and 4B, the plate unit 32 includes cable insertion holes 48, and positioning portions 50 formed on one surface of the plate unit 32. The plate unit 32 has substantially the same surface area as the area of the one surface of each of the module bodies 28A and 28B. The cable insertion hole 48 is a through-hole that is open in a thickness direction of the plate unit 32, and a plurality (in the present embodiment, three) of the cable insertion holes 48 are disposed at equal intervals in the longitudinal direction of the plate unit 32. Each cable insertion hole 48 has the size allowing insertion of the sealing tube 30. A ring groove 44 is disposed on the opposite surface of the plate unit 32 concentrically with the corresponding cable insertion hole 48. The ring groove 44 has the size allowing the flange portion 42 of the sealing tube 30 to be sandwiched between the ring groove 44 and the one surface of the module body 28A or 28B to seal between the lead-in unit 26 and the module body 28A or 28B.

The positioning portion 50 includes a protruding portion 52, which protrudes from the one surface of the plate unit 32, and a through-hole 54 formed in the protruding portion 52. Two positioning portions 50 are disposed for each cable insertion hole 48, in other words, one positioning portion 50 is disposed on each side of the cable insertion hole 48 such that one cable insertion hole 48 is disposed between the positioning portions 50. The protruding portion 52 is disposed such that the through-hole 54 is open in a transverse direction of the plate unit 32. The protruding portion 52 includes a pressing portion 55 disposed at a position facing the cable insertion hole 48. The pressing portion 55 includes a flat surface so as to press the circumference of the sealing tube 30 inserted into the cable insertion hole 48.

The plate unit 32 includes a fixation hole 56 disposed at an appropriate position to allow insertion of a fastening member, such as a bolt, for fixing the lead-in unit 26 to the module body 28A or 28B. The fixation hole 56 is open in the thickness direction of the plate unit 32, and in the present embodiment, the two fixation holes 56 are disposed in addition to the fixation holes 56 disposed at four corners of the plate unit 32.

(2) Operations and Effects

The following describes operations and effects of the power supplying modules 22A and 22B configured as described above. A procedure of attaching the lead-in unit 26 to the module body 28A or 28B will be first described. Each sealing tube 30 is first inserted into the plate unit 32 of the corresponding lead-in unit 26 so that the flange portion 42 is fitted into the ring groove 44 formed on the opposite surface of the plate unit 32. Subsequently, the plate unit 32 with the sealing tubes 30 inserted therein is fixed to the one surface of the module body 28A or 28B. The flange portion 42 of each sealing tube 30 seals between the plate unit 32 and the module body 28A or 28B.

Subsequently, the single-core cable 36 is inserted into the sealing tube 30. The conductive wire 37 at a leading end portion of the single-core cable 36 is connected to the electric connection unit 43. In a state that the single-core cable 36 has been thus inserted, a pair of the circumference holding units 34 are disposed around the circumference of the sealing tube 30. To fasten the circumference holding units 34, the fastening portions 40 are disposed to face each other with the protruding portions 52 disposed between the fastening portions 40, and a fastening member is inserted from one of the fastening portions 40 to the other fastening portion 40 through the through-hole 54 of the protruding portion 52 and fastened. Accordingly, sealing is provided between the single-core cable 36 and the sealing tube 30. In this manner, the lead-in unit 26 is attached to the module body 28A or 28B, and a power supply line is led into the module body 28A or 28B.

Figure 5:
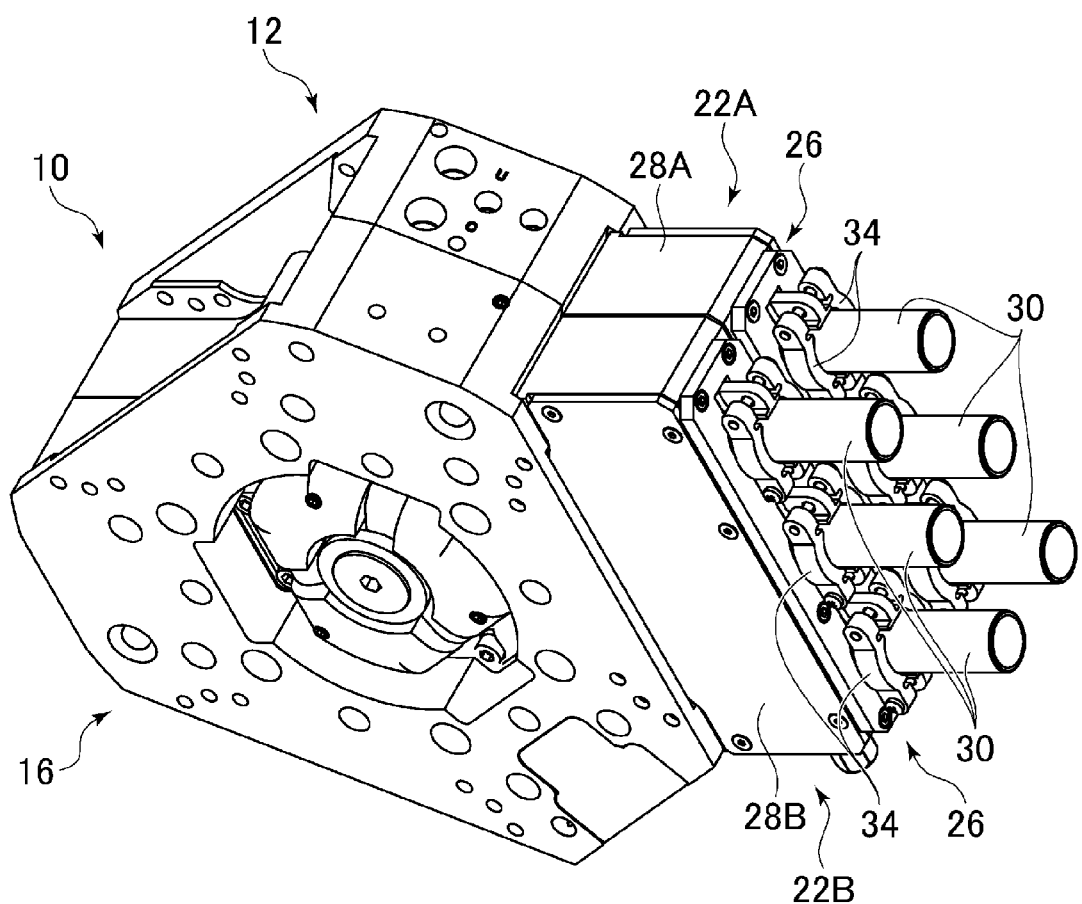
FIG. 5 is a perspective view illustrating the power supplying module according to the present embodiment when a male member and a female member are coupled to each other.
Figure 6:
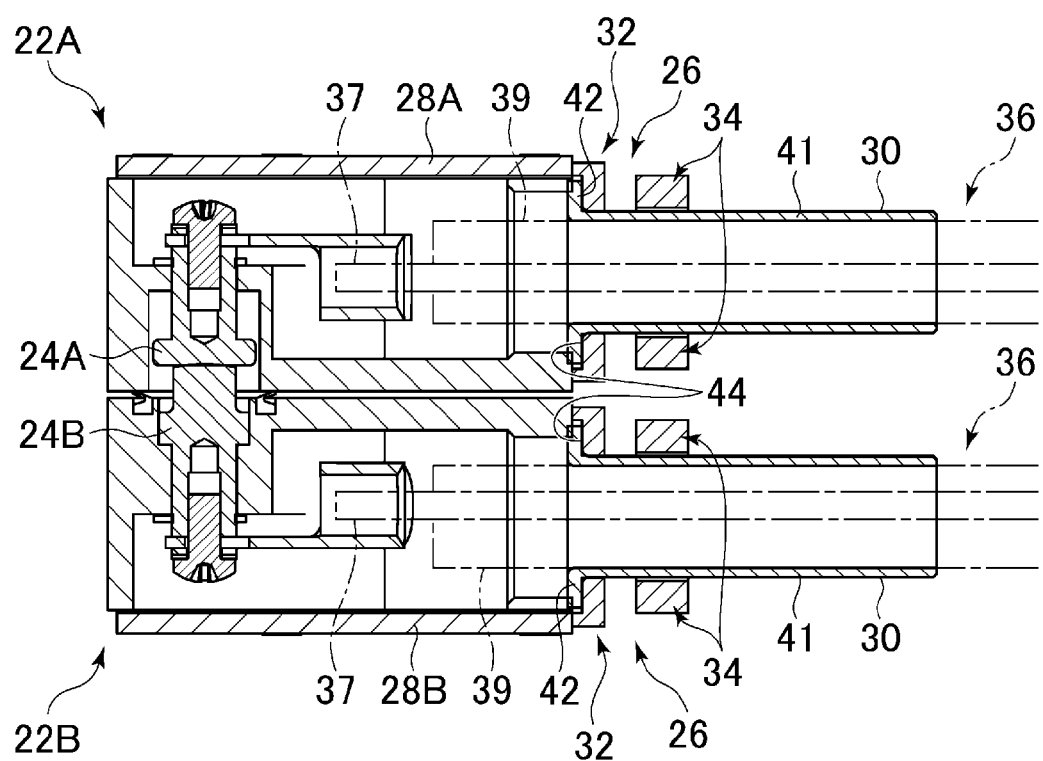
FIG. 6 is a longitudinal sectional view partially illustrating the power supplying module according to the embodiment when the male member and the female member are coupled to each other.

The power supplying modules 22A and 22B configured as described above are attached to the male member 12 and the female member 16, respectively. The male member 12 and the female member 16 are coupled to each other as illustrated in FIG. 5 to couple the industrial robot and the tool. When the male member 12 and the female member 16 are coupled to each other, the contact portions 24A and 24B are electrically connected to each other as illustrated in FIG. 6. With this configuration, electrical power is supplied from the body to the tool 14 via the power supplying modules 22A and 22B through the single-core cables 36.

According to the present embodiment, in each lead-in unit 26, the triplex cable is separated into the three single-core cables 36, and the single-core cables 36 are disposed in a row in the longitudinal direction of the one surface of the module body 28A or 28B. Thereby the thicknesses of the module bodies 28A and 28B are reduced. Accordingly, the power supplying modules 22A and 22B are reduced in size.

In the protruding portion 52, the through-hole 54 is open in the transverse direction of the plate unit 32 to allow a fastening member for fastening a pair of the circumference holding units 34 to be inserted into the through-hole 54 in the thickness direction of the module body 28A or 28B. With this configuration, in the power supplying modules 22A and 22B, the fastening member is easily fastened by a fastening tool that fastens the fastening member, without interference with the protruding portions 52 and the single-core cables 36. Thereby operability is improved. The protruding portion 52, which is integrally formed with the plate unit 32, allows the position of the fastening member to be maintained even when the single-core cable 36 is bent.

In the lead-in unit 26, a predetermined region of the circumference of the sealing tube 30 is held, with respect to the plate unit 32, by a pair of the circumference holding units 34 and the pressing portions 55, which are included in the protruding portions 52. With this configuration, the sealing property provided by the sealing tube 30 is maintained even when the other end of the single-core cable 36 having its leading end led in is bent.

In addition, the lead-in unit 26 according to the present embodiment may be curved in the longitudinal direction, Thereby design flexibility is improved.

The lead-in unit 26 is configured so that the sealing tube 30 generates a clamping force. Thereby a simplified configuration is achieved.

(3) Modified Embodiments

The present invention is not limited to the above-described embodiment, but appropriate change thereof is allowed within the scope of the present invention.

The above-described embodiment describes the case in which the three single-core cables 36 are disposed in a row in the lead-in unit 26 in the longitudinal direction of the one surface of the module body 28A or 28B. The present invention is not limited thereto. The four single-core cables 36 or more may be disposed.

The above-described embodiment describes the case in which the circumference holding units 34 are used in pair, each including the arc-shaped portion 35 and the fastening portions 40 provided at both ends of the arc-shaped portion 35. The present invention is not limited thereto. The pair of fastening portions 40 may be integrated as one member having a C shape. In this case, only one positioning portion 50 is provided for each cable insertion hole 48.

The above-described embodiment describes the case in which electrical power is transferred through a cable between the power supplying modules 22A and 22B. The present invention is not limited thereto and is applicable to transmission of an electric signal through a signal cable.

Although the above-described embodiment describes the industrial robot as an example of an instrument, an instrument to which a tool changer including a power supplying module is attached is not limited to an industrial robot. Examples of the instrument include a tool attached to an arm, and a balance arm and a hand crane that facilitate moving an object held by the tool and work after moving the object. Although the first coupling member is attached to the arm, which is the body, of the industrial robot, the first coupling member may be attached to any position on the body of the instrument depending on the configuration of the instrument and the kind of the tool used.

REFERENCE SIGNS LIST 10 tool changer
12 male member (first coupling member)
14 tool
16 female member (second coupling member)
22A, 22B power supplying module
26 lead-in unit
28A, 28B module body
30 sealing tube
32 plate unit
34 circumference holding unit
42 flange portion
48 cable insertion hole
52 protruding portion
54 through-hole

The invention claimed is:

1. A power supplying module detachably attached to one of a first coupling member and a second coupling member that are included in an automatic tool changer, the first coupling member being detachably attached to a body of an instrument, the second coupling member being detachably attached to a tool of the instrument, the power supplying module comprising:
   a module body; and
   a lead-in unit provided on one surface of the module body, the lead-in unit including:
      a plate unit that fixes at least one sealing tube to the one surface of the module body; and
      at least one circumference holding unit holding a circumference of the corresponding sealing tube, and
   wherein the plate unit is provided with, in a longitudinal direction of the one surface of the module body, a plurality of cable insertion holes, each of the plurality of cable insertion holes has a size to allow insertion of the at least one sealing tube, and a plurality of positioning portions that position the plurality of circumference holding units to the corresponding cable insertion holes.

2. The power supplying module according to claim 1, wherein each of the positioning portions includes:
   a protruding portion protruding from one surface of the plate unit, and
   a through-hole that is formed in the protruding portion and through which a fastening member is inserted through a pair of the circumference holding units disposed to face each other with respect to the protruding portion.

3. The power supplying module according to claim 2, wherein the through-hole is open in a transverse direction of the plate unit.

4. The power supplying module according to claim 1, wherein a ring groove into which a flange portion formed at a leading end of the sealing tube is fitted is formed on an opposite surface of the plate unit.

* * * * *